US012513851B2

(12) United States Patent
Yoshida

(10) Patent No.: US 12,513,851 B2
(45) Date of Patent: Dec. 30, 2025

(54) ELECTRONIC DEVICE AND CONTROL METHOD

(71) Applicant: CANON KABUSHIKI KAISHA, Tokyo (JP)

(72) Inventor: Daisuke Yoshida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 225 days.

(21) Appl. No.: 18/047,172

(22) Filed: Oct. 17, 2022

(65) Prior Publication Data

US 2023/0126416 A1    Apr. 27, 2023

(30) Foreign Application Priority Data

Oct. 21, 2021    (JP) ................................ 2021-172653

(51) Int. Cl.
*H05K 7/20*    (2006.01)
(52) U.S. Cl.
CPC ..... *H05K 7/20209* (2013.01); *H05K 7/20136* (2013.01)
(58) Field of Classification Search
None
See application file for complete search history.

(56) References Cited

U.S. PATENT DOCUMENTS 10,004,158 B2 *    6/2018  Abe ................... H05K 7/20209
10,694,638 B1 *    6/2020  Lin .................... H05K 7/20209
2011/0205071 A1 *  8/2011  Namekawa ............ H04N 23/65
                                                        361/103
2013/0037533 A1 *  2/2013  Namekawa ............ H04N 23/60
                                                        374/102
2014/0063739 A1 *  3/2014  Liu .................... H05K 7/20909
                                                        361/695
2017/0108903 A1 *  4/2017  Che .......................... G05B 9/02
2020/0238788 A1 *  7/2020  Wu ..................... H01M 10/637
2022/0117113 A1 *  4/2022  Baran ................. H05K 7/20409
2022/0192047 A1 *  6/2022  Ibrahim ................. H02M 7/797
2022/0418159 A1 * 12/2022  Gao .................... H05K 7/20272

FOREIGN PATENT DOCUMENTS

JP    2002-163039 A    6/2002
JP    2012-198736 A   10/2012
JP    2017-037113 A    2/2017
WO    2010/050080 A    5/2010

* cited by examiner

*Primary Examiner* — Courtney L Smith
(74) *Attorney, Agent, or Firm* — Canon U.S.A., Inc. IP Division

(57) ABSTRACT

An electronic device includes a control unit that performs a first control for driving a cooling unit for cooling an interior of the electronic device when a temperature of an internal device of the electronic device becomes greater than or equal to a first threshold. The control unit performs a second control for driving the cooling unit when a difference between a first power amount increased by a temperature rising of the internal device if the cooling unit is not driven and a second power amount increased by the temperature rising of the internal device if the cooling unit is driven is greater than driving power of the cooling unit.

19 Claims, 3 Drawing Sheets

ELECTRONIC DEVICE AND CONTROL METHOD

BACKGROUND

Field

The present disclosure relates to a technique for controlling a cooling unit of an electronic device.

Description of the Related Art

Japanese Patent Laid Open No. 2017-37113 describes a method of starting to drive a cooling fan if a magnitude of power of a thermoelectric conversion element corresponding to a temperature of a heating member reaches a first predetermined value and stopping the driving of the cooling fan after the magnitude of the power of the thermoelectric conversion element corresponding to the temperature of the heating member reaches a second predetermined value that is smaller than the first predetermined value.

Since the method described in Japanese Patent Laid Open No. 2017-37113 drives the cooling fan until the magnitude of the power of the thermoelectric conversion element corresponding to the temperature of the heating member reaches the second predetermined value, the power consumption due to the driving of the cooling fan increases.

In particular, since there are many cases in which a rechargeable battery such as a lithium-ion battery is used and a capacity of the battery is limited in a small size electronic device, an operable time of the electronic device is shortened due to the increase in the power consumption.

SUMMARY

The present disclosure has been made in consideration of the aforementioned problems, and enables the electronic device to reduce the increase in the power consumption due to a temperature rising of the electronic device.

In order to solve the aforementioned problems, the present disclosure provides an electronic device comprising a control unit that performs a first control for driving a cooling unit for cooling an interior of the electronic device when a temperature of an internal device of the electronic device becomes greater than or equal to a first threshold, wherein the control unit performs a second control for driving the cooling unit when a difference between a first power amount increased by a temperature rising of the internal device if the cooling unit is not driven and a second power amount increased by the temperature rising of the internal device if the cooling unit is driven is greater than driving power of the cooling unit.

In order to solve the aforementioned problems, the present disclosure provides a method of controlling a cooling unit for cooling an interior of an electronic device comprising driving the cooling unit when a temperature of an internal device of the electronic device becomes greater than or equal to a first threshold, and driving the cooling unit when a difference between a first power amount increased by a temperature rising of the internal device if the cooling unit is not driven and a second power amount increased by the temperature rising of the internal device if the cooling unit is driven is greater than driving power of the cooling unit.

In order to solve the aforementioned problems, the present disclosure provides a non-transitory computer-readable storage medium storing a program for causing a computer to execute a method of controlling a cooling unit for cooling an interior of an electronic device comprising driving the cooling unit when a temperature of an internal device of the electronic device becomes greater than or equal to a first threshold, and driving the cooling unit when a difference between a first power amount increased by a temperature rising of the internal device if the cooling unit is not driven and a second power amount increased by the temperature rising of the internal device if the cooling unit is driven is greater than driving power of the cooling unit.

According to the present disclosure, it is possible to reduce the increase in the power consumption due to the temperature rising of the electronic device.

Further features of the present disclosure will become apparent from the following description of exemplary embodiments with reference to the attached drawings.

DESCRIPTION OF THE EMBODIMENTS

Figure 1:
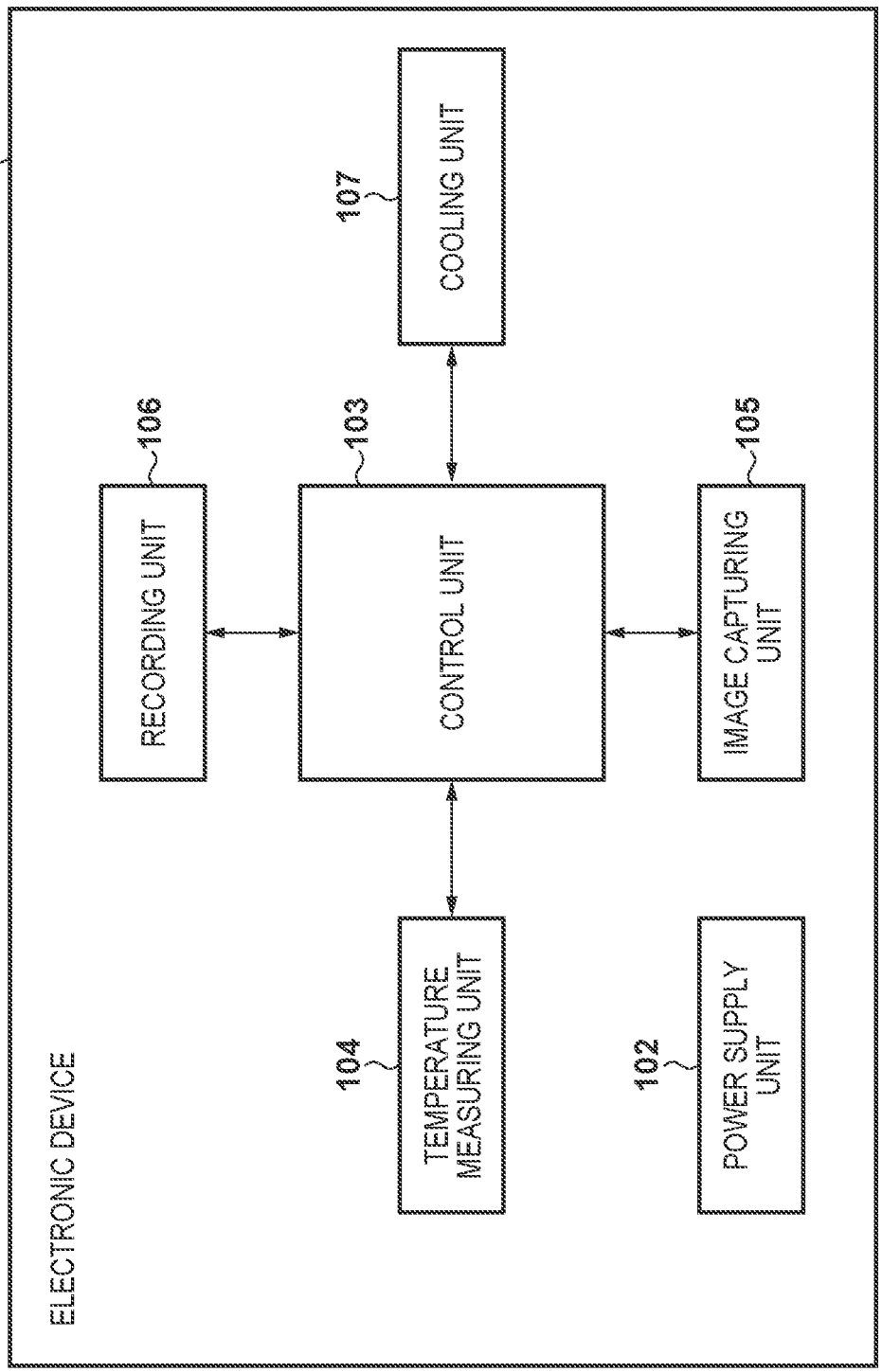
FIG. 1 is a block diagram illustrating components of electronic device 101 according to an exemplary embodiment.

Hereinafter, embodiments will be described in detail with reference to the attached drawings. Note, the following embodiments are not intended to be limiting. Multiple features are described in the embodiments, but all the limitations are not necessarily needed and multiple features can be combined as appropriate. The same reference numerals in the attached drawings are provided to the same or similar configurations, and redundant description thereof is omitted.

FIG. 1 is a block diagram illustrating the components of the electronic device 101 according to an exemplary embodiment.

In the present embodiment, a case where the electronic device 101 is an image capture apparatus such as a digital camera will be described. However, the electronic device 101 is not limited to the image capture apparatus, and can be any device having a cooling unit that cools a portable information terminal such as a smartphone or a tablet device, or other heat source devices.

As illustrated in FIG. 1, the electronic device 101 includes power supply unit 102, control unit 103, temperature measuring unit 104, image capturing unit 105, recording unit 106 and a cooling unit 107.

The power supply unit 102 supplies power to each component of the electronic device 101. The power supply unit 102 includes, for example, a power supply IC including a DC/DC converter or the like. The power supply unit 102, for example, converts a voltage supplied from a power source, such as a battery or an AC power adapter (not shown), into a voltage that elements or the like comprising each component of the electronic device 101 can operate.

The control unit 103 controls the electronic device 101. The control unit 103 includes, for example, a system LSI including a microprocessor and a memory chip such as a DRAM. The control unit 103 controls the temperature measuring unit 104, which is described below, the image capturing unit 105, the recording unit 106 and the cooling unit 107, which will is described below.

The temperature measuring unit 104 measures temperature information of the electronic device 101. The temperature measuring unit 104 includes, for example, a thermistor or a digital thermometer.

In the present embodiment, in the method of controlling the cooling unit 107 that is described below, the temperature measuring unit 104 is arranged in a position where the temperature measuring unit 104 can measure a temperature of a device (hereinafter, heat source device) serving as a heat source inside the electronic device 101, and a temperature external to the electronic device 101 (hereinafter, external temperature). The external temperature of the electronic device 101 is the temperature of the outer casing, such as the housing, of the electronic device 101. For example, when the electronic device 101 is an image capture apparatus, a temperature of the grip portion that a user uses to hold the image capture apparatus can be considered an external temperature.

In the present embodiment, the heat source device can be, for example, the system LSI and the memory IC include in the control unit 103, the power supply IC of the power supply unit 102, a sensor portion of the image capturing unit 105 or the like.

The image capturing unit 105 includes an image sensor comprised of a photoelectric conversion element such as a CMOS or a CCD. The image capturing unit 105 transmits image data captured by the image sensor to the control unit 103.

The recording unit 106 is a non-volatile memory such as a ROM, a memory card, a hard disk, or the like. The recording unit 106 stores a table or a characteristic formula representing a characteristic (hereinafter, referred to as a power temperature characteristic) representing a relationship between the temperature and the power consumption of the internal device serving as the heat source illustrated in FIG. 2A.

The cooling unit 107 cools an interior of the electronic device 101 to reduce the temperature rising of the heat source device inside the electronic device 101. The cooling unit 107 includes, for example, a blower fan or a Peltier element. The control unit 103 can change a cooling capacity of the cooling unit 107 by controlling a current amount applied to the blower fan or the Peltier element. When the temperature of the heat source device is high, since the cooling unit 107 requires a high cooling capacity, the driving power of the cooling unit 107 increases due to the temperature rising of the heat source device.

Figure 2:
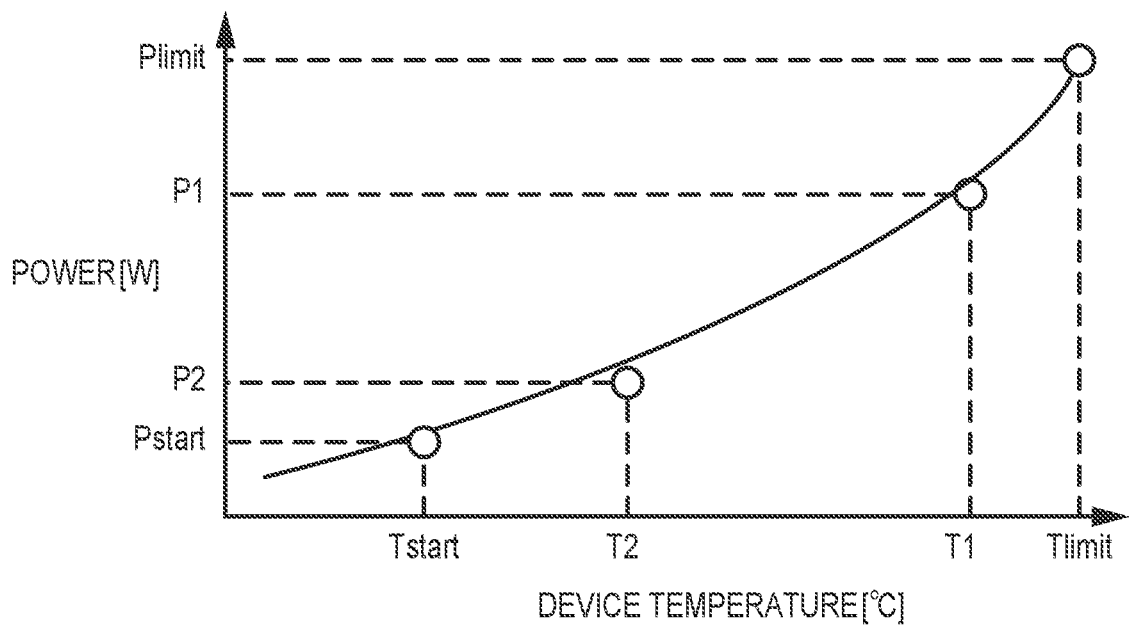
FIGS. 2A and 2B are diagrams illustrating a characteristic indicating a relationship between a temperature and a power consumption of a device serving as a heat source according to the exemplary embodiment.

As illustrated in FIG. 2A, the heat source device has a power temperature characteristic such that the power consumption increases by the increase in an internal leakage current or the like due to the temperature rising of the heat source device.

Temperature Tstart, for example, indicates the temperature at the time of starting the operation of the electronic device 101. The temperature Tstart is, for example, an outside air temperature. Power Pstart indicates the power at the temperature Tstart at the time of starting the operation of the electronic device 101.

Temperature T1 indicates the temperature that the heat source device reaches from the temperature Tstart at the time of starting the operation of the electronic device 101 if the cooling unit 107 is not driven. Power P1 indicates the amount of the power consumption increased by the temperature rising of the heat source device during the time from the temperature Tstart at the time of starting the operation of the electronic device 101 to the temperature T1.

Temperature T2 indicates the temperature that the heat source device reaches from the temperature Tstart at the time of starting the operation of the electronic device 101 if the cooling unit 107 is driven. Power P2 indicates the amount of the power consumption increased by the temperature rising of the heat source device during the time from the temperature Tstart at the time of starting the operation of the electronic device 101 to the temperature T2.

Temperature Tlimit indicates the temperature that limits the operation of the heat source device. Power Plimit indicates the amount of the power of the heat source device at the temperature Tlimit that limits the operation of the heat source device.

FIG. 2B is an example of a table indicating the amount of the power consumption by the temperature rising of the heat source device for each operation mode of the electronic device 101 derived from the power temperature characteristic of the heat source device illustrated in FIG. 2A.

The electronic device 101 can store, in the recording unit 106, the table as a formula representing the power temperature characteristic illustrated in FIG. 2A, or can store the table illustrated in FIG. 2B for each temperature. The electronic device 101 can obtain the power temperature characteristic illustrated in FIG. 2A or the table illustrated in FIG. 2B from an external server or the like and refer to it in the method of controlling the cooling unit 107 that is described below.

In the present embodiment, for simplifying the descriptions, an example of the control method when the table illustrated in FIG. 2B is used will be described. In the present embodiment, an example of a configuration in which the cooling unit 107 is built into the electronic device 101 is described. In another exemplary embodiment, the cooling unit 107 can be externally attachable to the electronic device 101.

In the present embodiment, the power for driving the cooling unit 107 is be supplied from the power supply unit 102 of the electronic device 101. In another exemplary embodiment, the power can be supplied from an external power supply via a connection terminal, such as USB (not illustrated) connectable to the cooling unit 107.

The method for controlling the cooling unit 107 by the electronic device 101 according to the present embodiment will now be described with reference to FIG. 3.

Figure 3:
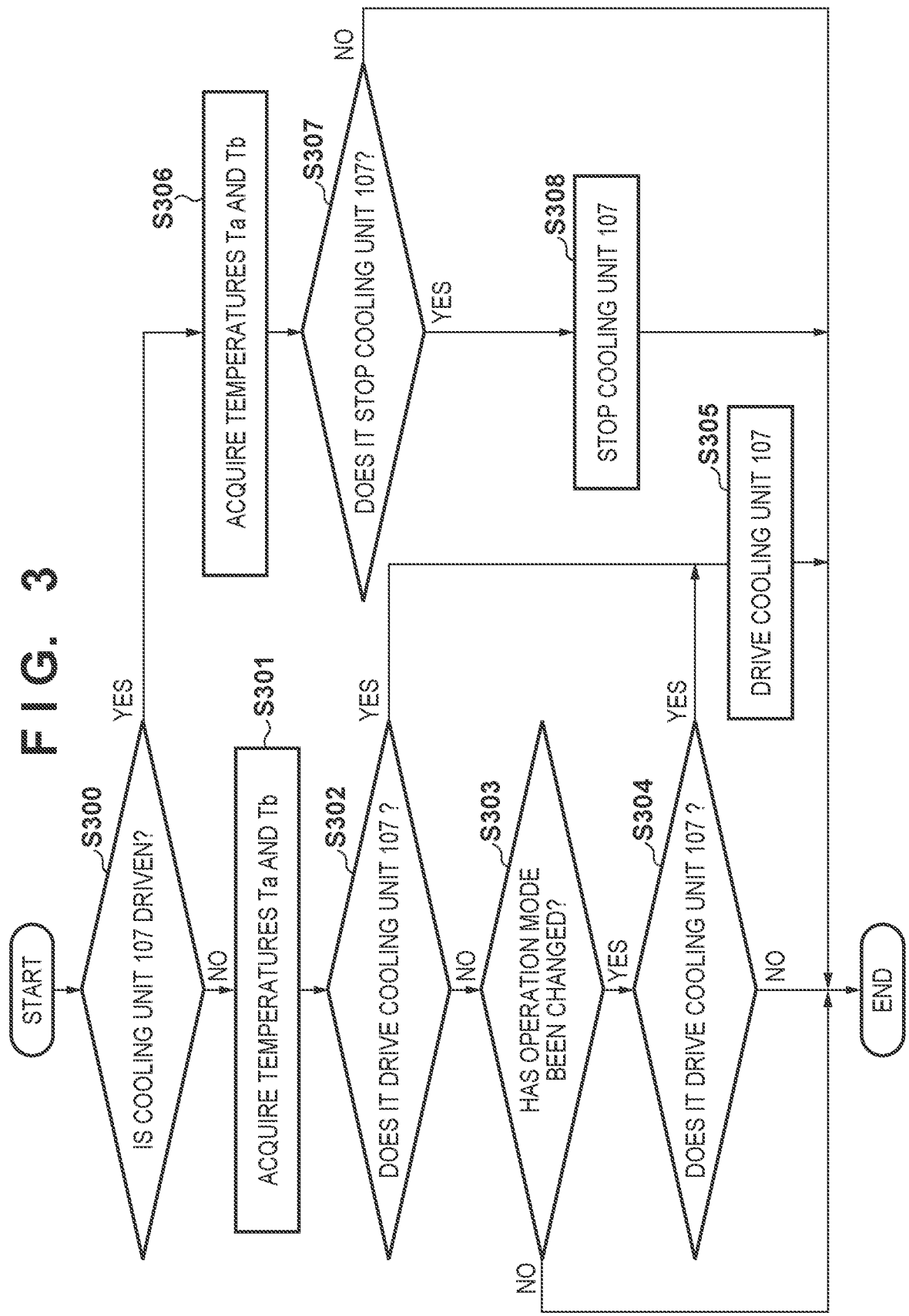
FIG. 3 is a flowchart illustrating a method of controlling cooling unit 107 by the electronic device 101 according to the exemplary embodiment.

The processing of FIG. 3 is realized by the control unit 103 executing programs stored in the recording unit 106 to control each component of the electronic device 101. The processing of FIG. 3 is executed, for example, at a predetermined cycle after the electronic device 101 is activated.

In step S300, the control unit 103 determines whether the cooling unit 107 is driven to cool the interior of the electronic device 101. The control unit 103 proceeds the processing to step S306 when the control unit 103 determines that the cooling unit 107 is driven. The control unit 103 proceeds the processing to step S301 when the control unit 103 determines that the cooling unit 107 is not driven.

In step S301, the control unit 103 acquires the temperature Ta of the heat source device and the external temperature Tb of the electronic device 101 from the temperature measuring unit 104.

In step S302, the control unit 103 determines whether to drive the cooling unit 107 based on the temperature Ta of the heat source device and the external temperature Tb of the electronic device 101 acquired in step S301.

A method for determining whether to drive the cooling unit 107 will now be described. In the present embodiment, a first threshold of the temperature of the heat source device for determining to drive the cooling unit 107 and a second threshold of the external temperature of the electronic device 101 are stored in advance in the recording unit 106. It is assumed that the first threshold of the temperature of the heat source device is Tath and the second threshold of the external temperature of the electronic device 101 is Tbth.

When the control unit 103 determines that the temperature Ta of the heat source device is greater than or equal to the first threshold Tath or the external temperature Tb of the electronic device 101 is greater than or equal to the second threshold Tbth, the control unit 103 proceeds the processing to step S305. When the control unit 103 determines that the temperature Ta of the heat source device is less than the threshold Tath and the external temperature Tb of the electronic device 101 is less than the second threshold Tbth, the control unit 103 proceeds the processing to step S303.

In step S303, the control unit 103 determines the current operation mode and whether the operation mode has changed from the previous processing. When the control unit 103 determines that the operation mode has changed from the previous processing, the control unit 103 proceeds the processing to step S304. When the control unit 103 determines that the operation mode has not changed from the previous processing, the control unit 103 ends the processing of the flowchart of FIG. 3.

When the electronic device 101 first performs the processing of the flowchart of FIG. 3 after the electronic device 101 starts operating, the control unit 103 determines that the operation mode has changed and proceeds the processing to step S304.

In step S304, the control unit 103 compares the power consumption by the heat source device and the driving power of the cooling unit 107 when the cooling unit 107 is driven and when the cooling unit 107 is not driven in the current operation mode, and determines whether to drive the cooling unit 107.

Hereinafter, an example in which the control unit 103 acquires the driving power P3 of the cooling unit 107 from the recording unit 106 will be described. In the present embodiment, it is assumed that, for example, P3=0.3 W.

The control unit 103 refers to the table of FIG. 2B from the recording unit 106 and acquires the power consumption amount P1 of the heat source device when the cooling unit 107 is not driven and the power consumption amount P2 of the heat source device when the cooling unit 107 is driven in the current operation mode. Then, the control unit 103 calculates the difference ΔP between the power consumption amounts of the heat source device in the cases of driving and not driving the cooling unit 107 according to the following Formula 1.

$$\Delta P = P1 - P2 \qquad \text{Formula 1}$$

Next, the control unit 103 compares the difference ΔP and the driving power P3, and determines whether the difference ΔP is greater than the driving power P3. When the control unit 103 determines that the difference ΔP is greater than the driving power P3, the control unit 103 proceeds the processing to step S305. When the control unit 103 determines that the difference ΔP is less than or equal to the driving power P3, the control unit 103 ends the processing of the flowchart of FIG. 3.

In step S305, the control unit 103 transmits a drive instruction to the cooling unit 107 to drive the cooling unit 107, and then ends the processing of the flowchart of FIG. 3.

In step S306, the control unit 103 acquires the temperature Ta of the heat source device and the external temperature Tb of the electronic device 101 from the temperature measuring unit 104.

In step S307, the control unit 103 determines whether to stop the cooling unit 107 based on the temperature Ta of the heat source device and the external temperature Tb of the electronic device 101 acquired in step S306.

A method for determining whether to stop the cooling unit 107 will now be described. In the present embodiment, a threshold of the temperature of the heat source device for determining to stop the cooling unit 107 and a threshold of the external temperature of the electronic device 101 are stored in advance in the recording unit 106.

The case where the cooling unit 107 is driving based on the determination of step S302 corresponds to the case where the electronic device 101 drives the cooling unit 107 such that the operation of the electronic device 101 is not restricted due to the temperature of the internal device (first control). In this case, it is assumed that a third threshold of the temperature of the heat source device for stopping the cooling unit 107 is Tbth1, and a fourth threshold of the external temperature of the electronic device 101 is Tbth1.

In this case, when the temperature Ta of the heat source device becomes less than the third threshold Tbth1, or when the external temperature Tb of the electronic device 101 becomes less than the fourth threshold Tbth1, the cooling unit 107 is stopped.

The case where the cooling unit 107 is driving based on the determination of step S304 corresponds to the case where the electronic device 101 drives the cooling unit 107 in order to reduce power consumption (second control). In this case, it is assumed that a fifth threshold of the temperature of the heat source device for stopping the cooling unit 107 is Tath2, and a sixth threshold of the external temperature of the electronic device 101 is Tbth2.

In this case, when the temperature Ta of the heat source device becomes less than the fifth threshold Tath2, or the external temperature Tb of the electronic device 101 becomes less than the sixth threshold Tbth2, the cooling unit 107 is stopped.

Here, the temperature of the third threshold Tbth1 is set to be higher than the temperature of the fifth threshold Tath2. The temperature of the fourth threshold Tbth1 is set to be higher than the temperature of the sixth threshold Tbth2.

The fifth threshold Tath2 and the sixth threshold Tbth2 are set to temperatures where the power amount increases due to the temperature rising of the heat source device during the operation of the electronic device 101 becomes sufficiently lower than the driving power of the cooling unit 107, that is, a lower temperature, for example, −10° C. or the like.

Then, the fifth threshold Tath2 and the sixth threshold Tbth2 become a temperature at which even if the temperature Ta of the heat source device increases in a state where the cooling unit 107 is not driven, the power consumption increased by the temperature rising of the heat source device becomes smaller than the driving power P3 of the cooling unit 107.

In a case where the cooling unit 107 is driving based on the determination of step S302 (first control), when the control unit 103 determines that the temperature Ta of the heat source device is less than the third threshold Tbth1, or the external temperature Tb of the electronic device 101 is less than the fourth threshold Tbth1, the control unit 103 proceeds the processing to step S308.

The control unit 103 determines that the temperature Ta of the heat source device is greater than or equal to the third threshold Tbth1 and the external temperature Tb of the electronic device 101 is greater than or equal to the sixth threshold Tbth2, the control unit 103 determines that the cooling unit 107 is not to be stopped (NO in step S307) and ends the processing of the flowchart of FIG. 3.

In a case where the cooling unit 107 is driving based on the determination of S304 (second control), when the control unit 103 determines that the temperature Ta of the heat source device is less than the fifth threshold Tath2, or the external temperature Tb of the electronic device 101 is less than the sixth threshold Tbth2, the control unit 103 proceeds the processing to step S308.

When the control unit 103 determines that the temperature Ta of the heat source device is greater than or equal to the fifth threshold Tath2 and the external temperature Tb of the electronic device 101 is greater than or equal to the sixth threshold Tbth2, the control unit 103 determines that the cooling unit 107 is not to be stopped (NO in step S307) and ends the processing of the flowchart of FIG. 3.

In step S308, the control unit 103 transmits a drive stop instruction to the cooling unit 107 to stop the cooling unit 107, and then ends the processing of the flowchart of FIG. 3.

According to the present embodiment, when the control unit 103 does not drive the cooling unit 107 because the operation of the electronic device 101 is not restricted due to the temperature of the heat source device, the control unit 103 drives the cooling unit 107 if the power amount of the heat source device that can be reduced by cooling the heat source device is greater than the driving power of the cooling unit 107. Specifically, when the difference obtained by subtracting the power amount increased by the temperature rising of the heat source device if the cooling unit 107 is driven from the power amount increased by the temperature rising of the heat source device if the cooling unit 107 is not driven is greater than the driving power of the cooling unit 107, the control unit 103 drives the cooling unit 107. Thus, it is possible to reduce the power consumption of the electronic device 101 by reducing the power amount increased by the temperature rising of the heat source device. In particular, when the driving power of the cooling unit 107 is supplied from the power supply unit 102 of the electronic device 101, it is possible to reduce the power consumption of the power supply unit 102.

When the electronic device 101 drives the cooling unit 107 such that the operation of the electronic device 101 is not restricted due to the temperature of the heat source device, it is conceivable that the temperature of the heat source device is rising. In this case, it is conceivable that the driving power P3 of the cooling unit 107 is greater than the power amount P2 increased by the temperature rising of the heat source device.

In this case, since it is necessary to avoid that the operation of the electronic device 101 is restricted due to the temperature of the heat source device, the threshold temperature for stopping the cooling unit 107 is set to a temperature that is higher than the threshold temperature for stopping the cooling unit 107 when the electronic device 101 drives the cooling unit 107 in order to reduce the power consumption. This can reduce the power consumption of the heat source device and the driving power of the cooling unit 107 by cooling the heat source device while it is avoided that the operation of the electronic device 101 is restricted due to the temperature of the heat source device.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that these embodiments are not seen to be liming. The scope of the following claims is to be accorded the broadest interpretation so as to encompass all such modifications and equivalent structures and functions.

This application claims the benefit of Japanese Patent Application No. 2021-172653, filed Oct. 21, 2021 which is hereby incorporated by reference herein in its entirety.

What is claimed is:
1. An electronic apparatus comprising:
a cooling unit having a cooling element for cooling an interior of the electronic apparatus;
a temperature sensor configured to measure a temperature of a heat source device arranged inside the electronic apparatus;
at least one processor; and
at least one memory,
wherein the at least one processor and the at least one memory are configured to:
control a cooling capacity of the cooling unit by a current amount applied to the cooling element,
perform a first control for driving the cooling unit when the temperature of the heat source device arranged inside the electronic apparatus becomes greater than or equal to a first threshold, and
perform a second control for driving the cooling unit when a difference between a first power consumption of the electronic apparatus that increases due to a temperature rising of the heat source device in a case that the cooling unit is not driven and a second power consumption that increases due to the temperature rising of the heat source device in a case that the cooling unit is driven is greater than a power for driving the cooling unit.

2. The electronic apparatus according to claim 1,
wherein the at least one memory stores information indicating a characteristic indicating a relationship between a temperature and a power consumption of the heat source device for each operation mode of the electronic apparatus, and
wherein the at least one processor and the at least one memory are further configured to acquire the first power consumption and the second power consumption based on the stored information and calculate the difference between the first power consumption and the second power consumption.

3. The electronic apparatus according to claim 1, further comprising a power supply unit that supplies the power for driving the cooling unit.

4. The electronic apparatus according to claim 1, further comprising a temperature sensor that measures a temperature of an outer casing of the electronic apparatus,
wherein the at least one processor and the at least one memory are further configured to drive the cooling unit when the temperature of the heat source device is greater than or equal to the first threshold or the temperature of the outer casing is greater than or equal to a second threshold.

5. The electronic apparatus according to claim 4,
wherein the at least one processor and the at least one memory are further configured to:
when the at least one processor and the at least one memory drive the cooling unit by the first control, stop driving the cooling unit when the temperature of the heat source device is less than a third threshold or the temperature of the outer casing is less than a fourth threshold, and
when the at least one processor and the at least one memory drive the cooling unit by the second control, stop driving the cooling unit when the temperature of the heat source device is less than a fifth threshold or the temperature of the outer casing is less than a sixth threshold, and
wherein the third threshold is a temperature higher than the fifth threshold and the fourth threshold is a temperature higher than the sixth threshold.

6. The electronic apparatus according to claim 1, wherein the cooling unit is built into the electronic apparatus.

7. The electronic apparatus according to claim 1, wherein the cooling unit is externally attachable to the electronic apparatus.

8. A method of controlling an electronic apparatus,
wherein the electronic apparatus includes:
a cooling unit having a cooling element for cooling an interior of the electronic apparatus;
a temperature sensor configured to measure a temperature of a heat source device arranged inside the electronic apparatus;
at least one processor; and
at least one memory,
wherein the at least one processor and the at least one memory are configured to control a cooling capacity of the cooling unit by a current amount applied to the cooling element,
wherein the method comprises:
obtaining measurements of the temperature of the heat source device arranged inside the electronic apparatus from the temperature sensor configured to measure the temperature of the heat source device arranged inside the electronic apparatus;
performing a first control for driving the cooling unit when the temperature of the heat source device arranged inside the electronic apparatus becomes greater than or equal to a first threshold; and
performing a second control for driving the cooling unit when a difference between a first power consumption of the electronic apparatus that increases due to a temperature rising of the heat source device in a case that the cooling unit is not driven and a second power consumption that increases due to the temperature rising of the heat source device in a case that the cooling unit is driven is greater than a power for driving the cooling unit.

9. The method according to claim 8,
wherein the at least one memory stores information indicating a characteristic indicating a relationship between a temperature and a power consumption of the heat source device for each operation mode of the electronic apparatus, and
wherein the method further comprises acquiring the first power consumption and the second power consumption based on the stored information, and calculating the difference between the first power consumption and the second power consumption.

10. The method according to claim 8, further comprising supplying the power for driving the cooling unit.

11. The method according to claim 8, further comprising:
obtaining measurements of a temperature of an outer casing of the electronic apparatus, from a temperature sensor that measures the temperature of the outer casing of the electronic apparatus; and
driving the cooling unit when the temperature of the heat source device is greater than or equal to the first threshold or the temperature of the outer casing is greater than or equal to a second threshold.

12. The method according to claim 11, further comprising:
when the cooling unit is driven by the first control, stopping driving the cooling unit when the temperature of the heat source device is less than a third threshold or the temperature of the outer casing is less than a fourth threshold, and
when the cooling unit is driven by the second control, stopping driving the cooling unit when the temperature of the heat source device is less than a fifth threshold or the temperature of the outer casing is less than a sixth threshold,
wherein the third threshold is a temperature higher than the fifth threshold and the fourth threshold is a temperature higher than the sixth threshold.

13. The method according to claim 8, wherein the cooling unit is built into the electronic apparatus.

14. The method according to claim 8, wherein the cooling unit is externally attachable to the electronic apparatus.

15. A non-transitory computer-readable storage medium storing a program for causing a computer to execute a method of controlling a cooling unit for cooling an interior of an electronic apparatus, the cooling unit having a cooling element for cooling an interior of the electronic apparatus, the computer controlling a cooling capacity of the cooling unit by a current amount applied to the cooling element, the method comprising:
obtaining measurements of a temperature of a heat source device arranged inside the electronic apparatus from a temperature sensor configured to measure the temperature of the heat source device arranged inside the electronic apparatus;

performing a first control for driving the cooling unit when the temperature of the heat source device arranged inside the electronic apparatus becomes greater than or equal to a first threshold; and performing a second control for driving the cooling unit when a difference between a first power consumption of the electronic apparatus that increases due to a temperature rising of the heat source device in a case that the cooling unit is not driven and a second power consumption that increases due to the temperature rising of the heat source device in a case that the cooling unit is driven is greater than a power for driving the cooling unit.

16. The storage medium according to claim 15, wherein the storage medium stores information indicating a characteristic indicating a relationship between a temperature and a power consumption of the heat source device for each operation mode of the electronic apparatus, and wherein the method further comprises acquiring the first power consumption and the second power consumption based on the stored information, and calculating the difference between the first power consumption and the second power consumption.

17. The storage medium according to claim 15, wherein the method further comprises supplying the power for driving the cooling unit.

18. The storage medium according to claim 15, wherein the method further comprises:

obtaining measurements of a temperature of an outer casing of the electronic apparatus from a temperature sensor that measures the temperature of the outer casing of the electronic apparatus; and driving the cooling unit when the temperature of the heat source device is greater than or equal to the first threshold or the temperature of the outer casing is greater than or equal to a second threshold.

19. The storage medium according to claim 18, wherein the method further comprises:

when the cooling unit is driven by the first control, stopping driving the cooling unit when the temperature of the heat source device is less than a third threshold or the temperature of the outer casing is less than a fourth threshold, and when the cooling unit is driven by the second control, stopping driving the cooling unit when the temperature of the heat source device is less than a fifth threshold or the temperature of the outer casing is less than a sixth threshold, wherein the third threshold is a temperature higher than the fifth threshold and the fourth threshold is a temperature higher than the sixth threshold.

* * * * *